US010366912B2

(12) United States Patent
Takahashi et al.

(10) Patent No.: US 10,366,912 B2
(45) Date of Patent: Jul. 30, 2019

(54) STAGE APPARATUS AND CHARGED PARTICLE BEAM APPARATUS (71) Applicant: Hitachi High-Technologies Corporation, Minato-ku, Tokyo (JP)

(72) Inventors: Motohiro Takahashi, Tokyo (JP); Masaki Mizuochi, Tokyo (JP); Shuichi Nakagawa, Tokyo (JP); Naruo Watanabe, Tokyo (JP); Hironori Ogawa, Tokyo (JP); Takanori Kato, Tokyo (JP); Akira Nishioka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/902,639

(22) Filed: Feb. 22, 2018

(65) Prior Publication Data
US 2018/0247855 A1   Aug. 30, 2018

(30) Foreign Application Priority Data
Feb. 27, 2017   (JP) ................................ 2017-034274

(51) Int. Cl.
H01J 37/20      (2006.01)
H01J 37/26      (2006.01)
H01L 21/687     (2006.01)
H01L 21/68      (2006.01)

(52) U.S. Cl.
CPC ........ H01L 21/68764 (2013.01); H01J 37/26 (2013.01); H01L 21/68 (2013.01); H01J 2237/20278 (2013.01)

(58) Field of Classification Search
CPC . H01J 37/26; H01J 2237/20278; H01L 21/68; H01L 21/68764; G03F 7/70716
See application file for complete search history.

(56) References Cited

U.S. PATENT DOCUMENTS

| 7,081,950 | B2  | 7/2006  | Ukaji |
|---|---|---|---|
| 2007/0103660 | A1  | 5/2007  | Tanaka |
| 2010/0283986 | A1* | 11/2010 | Shibazaki ........... G03F 7/70716 355/72 |

(Continued)

FOREIGN PATENT DOCUMENTS

| EP | 1 422 571 B1 | 9/2008 |
|---|---|---|
| EP | 1 610 362 B1 | 9/2016 |

(Continued)

OTHER PUBLICATIONS

Taiwanese-language Office Action issued in counterpart Taiwanese Application No. 107105959 dated Nov. 19, 2018 (six (6) pages).

Primary Examiner — Eliza W Osenbaugh-Stewart
(74) Attorney, Agent, or Firm — Crowell & Moring LLP (57) ABSTRACT An object of the invention is to provide a stage apparatus that realizes compatibility between long stroke driving and reduction of a burden on a drive mechanism. In order to achieve the above object, there is suggested a stage apparatus including a first table that moves a sample in a first direction, a second table that moves the first table in a second direction different from the first direction, moving mechanisms that move the tables, respectively, a movable body that supports a moving mechanism, and a third moving mechanism that moves the movable body so as to follow the second table.

7 Claims, 4 Drawing Sheets (56) References Cited

U.S. PATENT DOCUMENTS

2011/0007325 A1    1/2011   Ichinose
2012/0057140 A1    3/2012   Aoki
2019/0049856 A1*   2/2019   Aoki ........................ G03F 7/20

FOREIGN PATENT DOCUMENTS

| JP | 2003-45785 A | 2/2003 |
| TW | 201120581 A1 | 6/2011 |
| TW | 201216014 A1 | 4/2012 |
| WO | WO 2012/032768 A1 | 3/2012 |

\* cited by examiner

STAGE APPARATUS AND CHARGED PARTICLE BEAM APPARATUS

TECHNICAL FIELD

The present disclosure relates to a stage apparatus and a charged particle beam apparatus, and particularly, relates to a stage apparatus and a charged particle beam apparatus that realizes weight reduction of a stage, suppression of a positioning error of the stage, or the like.

BACKGROUND ART

Charged particle beam apparatuses, such as an electron microscope used for manufacture, measurement, inspection, and the like of semiconductor wafers are provided with a stage that moves the position of a sample in order to irradiate a desired position of the sample with a beam. Such a stage is provided with a drive mechanism for moving the sample in at least two directions so as to move the sample in two-dimensional directions. Additionally, PTL 1 discloses a stage apparatus using both a coarse movement stage and a slight movement stage. More specifically, PTL 1 discloses a stage apparatus that supports a stage on which the sample is placed by a second drive device that is capable of performing slight movement driving in two directions, and supports the stage by a first drive device that is a coarse movement mechanism that moves the second drive device in one direction. By dividing the drive mechanism into two in this way, a load (movable mass) on one drive mechanism can be reduced. More specifically, the stage apparatus that is supported by a pneumatic hydrostatic bearing (second drive device) that moves the stage, on which the sample is placed, in one direction and in the other direction, and that moves the second drive device by a uniaxial stage (first drive device) is disclosed. By dividing the drive mechanism into a plurality of drive mechanisms in this way, it is possible to reduce a burden that one drive mechanism bears.

CITATION LIST

Patent Literature

PTL 1: JP-A-2003-45785

SUMMARY OF INVENTION

Technical Problem

According to the configuration disclosed in PTL 1, a load on the drive mechanism for performing the slight movement driving can be reduced. However, a burden on the drive mechanism for performing the long stroke driving cannot be reduced. Particularly, the apparatuses that measure and inspect semiconductor wafers or the like handle disk-like large-sized samples (semiconductor wafers). Therefore, after the drive mechanism that performs the long stroke driving is adopted, it is desirable to reduce a burden on the drive mechanism.

In the following, a stage apparatus and a charged particle beam apparatus aiming to realize compatibility between long stroke driving and reduction of a burden on a drive mechanism are suggested.

Solution to Problem

As one aspect for achieving the above object, there is suggested a stage apparatus including a first table that supports a sample and moves the sample in a first direction; a second table that moves the first table in a second direction different from the first direction; a first moving mechanism that generates a driving force for moving the first table in the first direction; a second moving mechanism that generates a driving force for moving the second table in the second direction; a movable body that supports a stator included in the first moving mechanism; and a third moving mechanism that moves the movable body so as to follow the movement of the second table in the second movement direction, and a charged particle beam apparatus.

Advantageous Effects of Invention

According to the above configuration, it is possible to achieve compatibility between long stroke driving and reduction of a burden on a drive mechanism.

DESCRIPTION OF EMBODIMENTS

Along with the recent microfabrication of semiconductor devices, high throughput corresponding to an increase in inspection or measurement locations are required for not only manufacturing apparatuses but also inspection apparatuses or measuring apparatuses. For example, in a case where positioning time is shortened by half, it is necessary to increase the acceleration 4 times. In order to increase the acceleration 4 times in the same stage, it is necessary to increase motor thrust 4 times and to increase the coil current amount of a motor 4 times. Since motor heat generation increases in proportion to the square of the current amount, the amount of the motor heat generation in a case when the positioning time is shortened by half reaches 16 times.

Meanwhile, in a case where the thrust constant of the motor is constant, the motor current amount is proportional to the movable mass of a stage. That is, since the motor heat generation amount is proportional to the square of the movable mass, in a case where the movable mass of the stage is reduced to ¼, the motor heat generation is ¹/₁₆, and it is possible to offset an increase in heat generation in a case where the positioning time is reduced by half.

As described above, reducing the movable mass of the stage is an important factor that acts by the square in a decrease in heat generation and an improvement in throughput. Thus, it is considered that a motor stator that occupies a large proportion of movable mass is separated.

The embodiments to be described below particularly relate to a stage apparatus which moves a sample in an X-Y direction and in which a lower stage table is not made to bear the movement of a stator of a drive mechanism that moves an upper stage table, but a movable body, which moves in the same direction as the lower stage table, is provided on a bottom part (for example, a bottom surface of a vacuum chamber) so as to support the stator of the drive mechanism of the upper stage table, and a drive mechanism that moves the movable body so as to follow the lower stage table is provided. This stage apparatus will be described. As a specific configuration for that, for example, there are suggested a sample stage apparatus and a charged particle beam apparatus using the stage. The sample stage apparatus is characterized by including a first table (upper stage table) that supports the sample and moves the sample in a first direction, and a second table (lower stage table) that moves the first table in a second direction different from the first direction and including a movable body (movable body) that supports a stator included in a drive mechanism that moves the first table in the first direction and moves the stator in the second direction along with the movement of the second table. The movable body is able to adopt a drive mechanism separate from the drive mechanism that drives the lower stage table, thereby decentralizing the load for moving a moving mechanism of the upper stage table.

According to the above configuration, in the stage apparatus having a linear motor, it is possible to easily reduce the movable mass, and it is possible to suppress an increase in heat generation resulting from high acceleration shorten the positioning time.

Embodiment 1

The embodiment to be described below relates to a stage apparatus including a structure in which an upper-axis stator is separated from a lower-axis table, in a stack-type XY stage. In general stack-type XY stages, an upper-axis motor stator for driving an upper-axis table is mounted on the lower-axis table. Since the motor stator is often a yoke made of a material, such as a permanent magnet or iron and has a large mass, the movable mass of the lower-axis table increases. Particularly, compared to the upper-axis table, in the lower-axis table, the mass of the upper-axis table also becomes the movable mass. Therefore, in the stack-type XY stage, a load to the lower-axis motor may be large and heat generation may increase, or the vibration characteristics and positioning properties of the lower-axis table may deteriorate.

A stage structure of the present disclosure is characterized by including a configuration in which the upper-axis motor stator for driving the upper-axis table is mounted on a movable body different from the lower-axis table and is independently driven so as to following lower-axis table. According to the above configuration, there is provided the stage structure that suppresses the motor heat generation and residual stage vibration and enables high visual field positioning accuracy and high-speed positioning.

Figure 1:
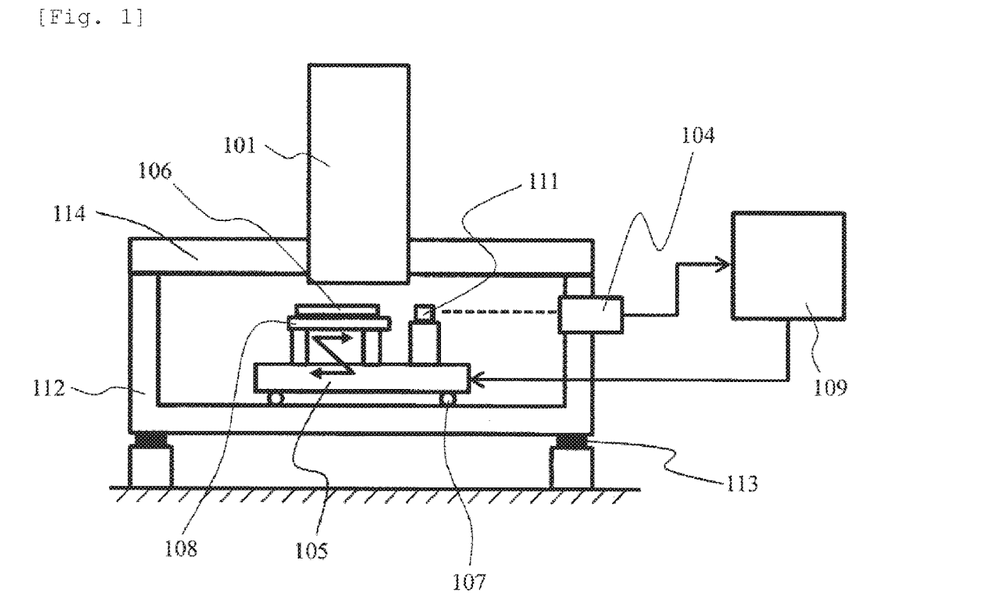
FIG. 1 is a view illustrating the configuration of a charged particle beam apparatus.

An example of the charged particle beam apparatus will be described with reference to FIG. 1. Here, an example of a semiconductor measuring apparatus (hereinafter, referred to as a length measuring SEM) will be described as the example of the charged particle beam apparatus. In the length measuring SEM, an electronic optical system lens barrel 101 is mounted on a sample chamber 112, and the sample chamber 112 is supported by a vibration-free mount 113. An electron beam is irradiated onto a wafer 106 from the electronic optical system lens barrel 101, a pattern on a wafer 106 is imaged, and measurement of the line width of the pattern or evaluation of shape accuracy is performed. A stage having a table 105 as a movable part is mounted within the sample chamber 112, and a chuck 108 on which the wafer 106 that is an object to be observed is mounted is fixed to the table 105. Additionally, the table 105 is supported by a guide 107, the position of a mirror 111 is measured by a laser interferometer 104 to obtain stage coordinates, and positioning control of the table is performed by a controller 109.

If deformation occurs in the table 105, the relative distance between the chuck 108 and the mirror 111 fluctuates, and in a case where the position of an observation point on the wafer is managed with a laser length measurement value, deviation of an image occurs. However, in a case where there is reproducibility in the laser length measurement value and the deviation of the image also including the deformation of the table, it is possible to record the deviation amount of the image with respect to coordinates, thereby creating a correction map. By deducting the deviation amount of the image of the correction map from target position coordinates of the stage or beam shift amount, it is possible to set influence on the deviation of the image to a value close 0 with respect to reproducible table deformation.

However, in a case where there is no reproducibility in the deformation of the table or in a case where components without reproducibility are mixed, influence of positional deviation cannot be set to 0 even if the correction map is used. The deviation of the image that cannot be corrected is referred to as a visual field positioning error. Particularly, in order to measure a device having a pattern interval of several nanometers, it is necessary to reduce this visual field positioning error to an extreme.

Since thermal deformation of the stage or the wafer resulting from the motor heat generation or frictional heat generation in the guide does not necessarily have perfect reproducibility and is also large as an order, the effect of reducing the visual field positioning error is insufficient in temperature control or thermal deformation correction. Thus, a reduction in fundamental heat generation amount becomes important.

Figure 2:
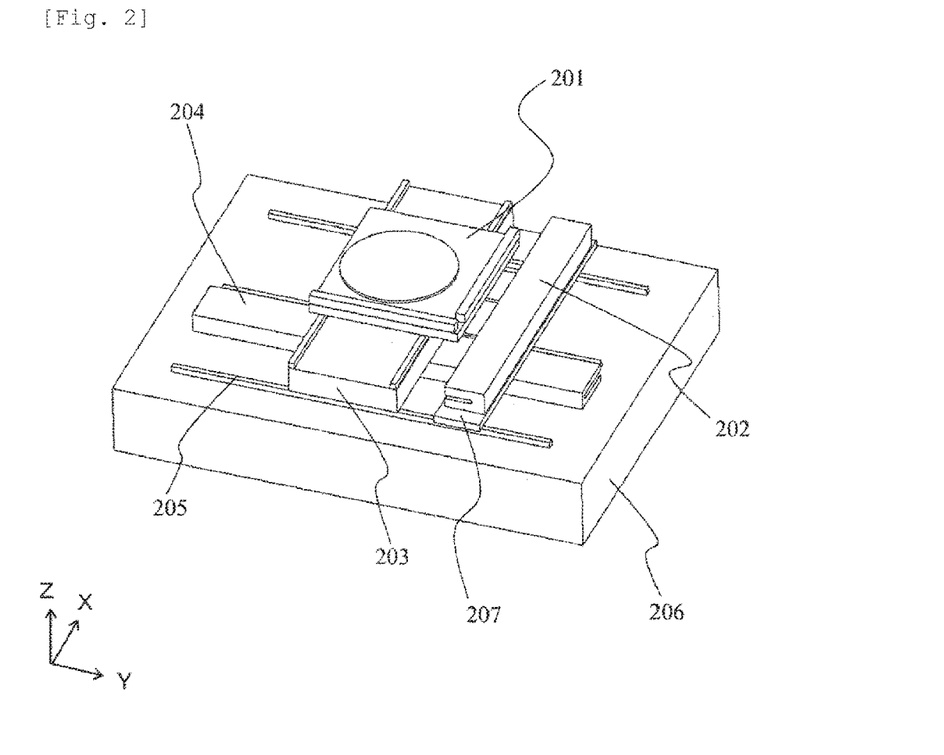
FIG. 2 is a view illustrating an example of a stage configuration of a motor-separated structure.

A configuration example of a stage structure (hereinafter referred to as a motor-separated structure) in which the upper-axis stator is separated from the lower-axis table in the stack-type XY stage suggested in the present disclosure will be described with reference to FIG. 2. In the stage apparatus to be described in the present embodiment, a linear motor mechanism including a stator and a mover is used as a moving mechanism that generates a driving force. In the example of FIG. 2, a stage mechanism for moving the sample in an X-Y direction is installed on a sample chamber bottom part 206. In addition, in the case of the charged particle beam apparatus, the sample chamber is a vacuum chamber, and the stage mechanism is disposed on the vacuum chamber bottom surface, a supporting member disposed on the vacuum chamber bottom surface, or the like.

An upper-axis table 201 (first table) holding the sample, such as a semiconductor wafer, is supported by a lower-axis table 203 (second table) provided with guide rails that guide the upper-axis table 201 in an X direction. The lower-axis table 203 is guided by with guide rails 205, and is moved in a Y direction by a linear motor (second moving mechanism) including a lower-axis motor stator 204 and a lower-axis motor mover (not illustrated).

In general stages, a stator of a linear motor that positions the upper-axis table 201 is mounted on the lower-axis table 203. However, in a case where the stator is a yoke, the mass of the lower-axis table increases, and a problem of an increase in heat generation or controllability degradation at the time of lower-axis driving occurs. In contrast, in the configuration of FIG. 2, an upper-axis motor stator 202 with large mass is separated from the lower-axis table 203, and a carriage, a drive element, and a position sensor corresponding to the guide rails 205 are provided so as to be capable of following the lower-axis table 203. Accordingly, the mass of a lower-axis movable part is markedly reduced, and an improvement in controllability and a reduction in heat generation are performed. As a result, an improvement in throughput and suppression of visual field deviation resulting from the thermal deformation are realized.

Additionally, since the upper-axis motor stator 202 is moved by a drive mechanism separate from the drive mechanism of the lower-axis table 203, even if the upper-axis motor stator 202 is enlarged, this does not become a burden on the drive mechanism of the lower-axis table 203. As a result, it is possible to enlarge the upper-axis motor stator 202. If the stator is enlarged, the thrust constant of the motor increases. Accordingly, the amount of a current to be supplied to the mover can be reduced, and it is possible to reduce the amount of heat generation resulting from supplying the current. The thermal expansion of the table based on the reduction in the amount of heat to be transferred to the table can be suppressed, and it is possible to maintain the irradiation position accuracy of a charged particle beam in a high state.

Figure 3:
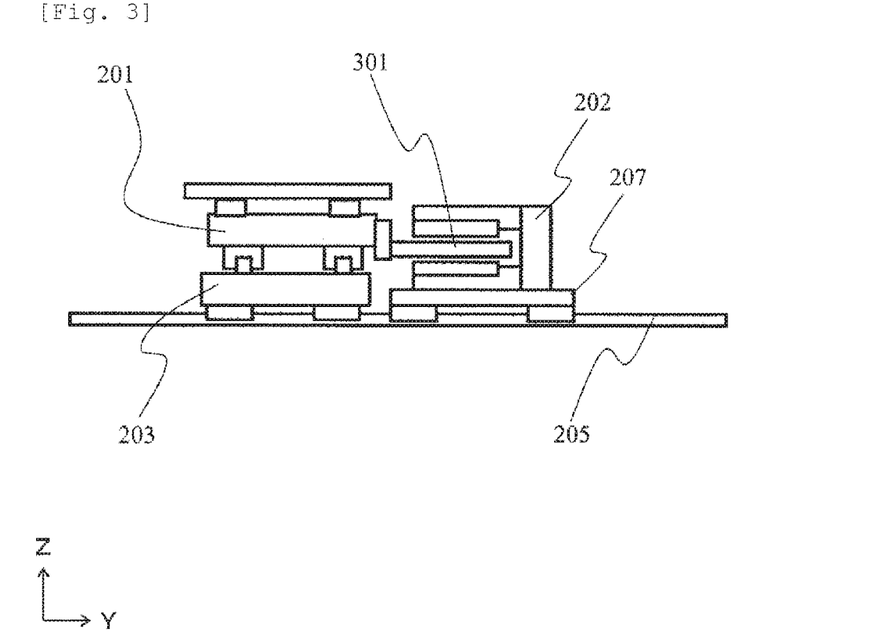
FIG. 3 is a view illustrating a schematic view of the motor-separated structure.

A schematic view of the stage of the present configuration is illustrated with reference to FIG. 3. In order to move the upper-axis motor stator 202 so as to follow the lower-axis table 203 that supports an upper-axis motor mover 301, a movable body 207 that supports the upper-axis motor stator 202 is provided, and a moving mechanism (third moving mechanism) for moving the movable body 207 together with the lower-axis table 203 is provided. In this way, in the present embodiment, the stator and the mover that constitute a first moving mechanism for moving the first table are respectively moved by different drive mechanisms.

While the second moving mechanism and the third moving mechanism use a common stator, these mechanisms have separate movers. However, in a positional relationship between a magnetic field formed by the yoke of the linear motor, and a coil, a positional error on the order of mm is allowable in a direction perpendicular to a drive direction. Therefore, if a following error with respect to the lower-axis table 203 of the upper-axis motor stator 202 is on the order of several hundreds of micrometers, controllability does not deteriorate and realization is easy. A motor reaction force in the drive direction of the upper-axis table 201 applied to the upper-axis motor stator 202 is supported by the guide rails 205, and does not cause a positioning error.

Figure 4:
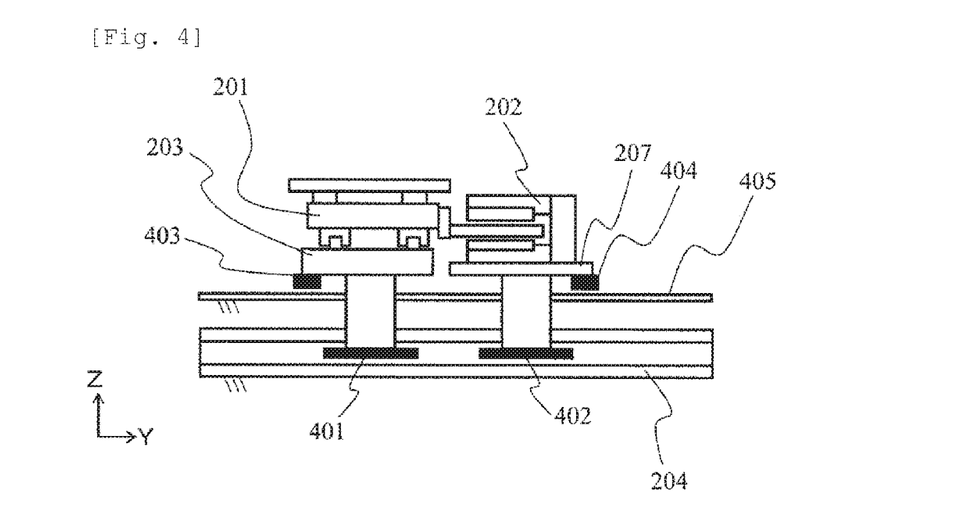
FIG. 4 is a view illustrating an example of a common structure of a lower-axis stator and scale.

FIG. 4 is a view illustrating a stage structure in which the movable body 207 that supports the upper-axis motor stator 202 is provided with a motor mover 402. In the present embodiment, a motor mover 401, which constitutes a linear motor that drives the lower-axis table 203, and the motor mover 402 are configured to move inside the common stator (lower-axis motor stator 204). Additionally, a configuration in which scale for specifying the position of the table or the movable body is shared is adopted. In positioning the upper-axis motor stator 202, it is possible to share the lower-axis table 203, the lower-axis motor stator 204, and lower-axis scale 405 to suppress a cost increase.

The position of the lower-axis table 203 is measured by a lower-axis scale head 403, and the position of the upper-axis motor stator 202 is measured by a scale head 404. Scale 405 can be shared by the two heads 403 and 404. The scale head is for specifying the position of the table or the like by reading graduations of the scale, physical quantity, or the like, and a detection surface thereof is disposed to face the scale.

The lower-axis table 203 is driven by the motor mover 401. The upper-axis motor stator 202 is driven by the motor mover 402. The motor stator 204 can be shared by the motor movers 401 and 402.

Figure 5:
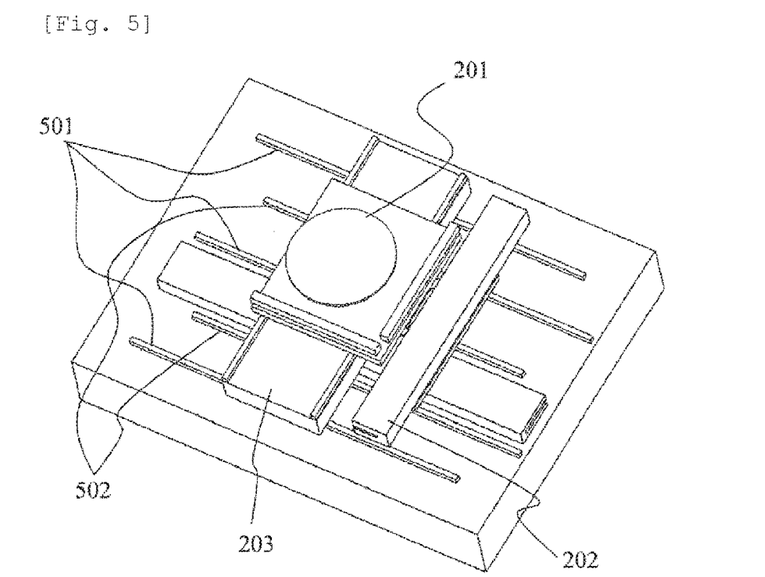
FIG. 5 is a view illustrating a configuration example in which a guide that supports an upper-axis stator is separately provided.

Referring to FIG. 5, a configuration example in which the guide that supports the upper-axis stator is separately provided is illustrated. By providing guide rails 502 that support the upper-axis stator separately from guide rails 501 that supports the lower-axis table 203, it is possible to prevent the heat of the motor driving the upper-axis motor stator 202 from being transmitted to a main stage via the guide rails 501. Particularly, in a case where the coil current of the upper-axis table 201 is lowered for low heat generation, in order to maintain a maximum thrust, it is necessary to enlarge the upper-axis stator 202 to increase magnetic flux density. In that case, the mass of the upper-axis stator 202 increases and heat generation on a stator driving side increases. Even in such a case, it is possible to separate the guide to suppress transfer of heat to the wafer. Additionally, since the positioning accuracy of the upper-axis stator 202 is not required to be as high as that of the lower-axis table 203, it is also possible to take a measure, such as changing the guide rails 502 to one having low rigidity and low rigidity. Additionally, even if the cost is reduced by changing the guide rails 502 to a low-accuracy one, the positioning accuracy of the lower-axis table 203 does not deteriorate.

Figure 6:
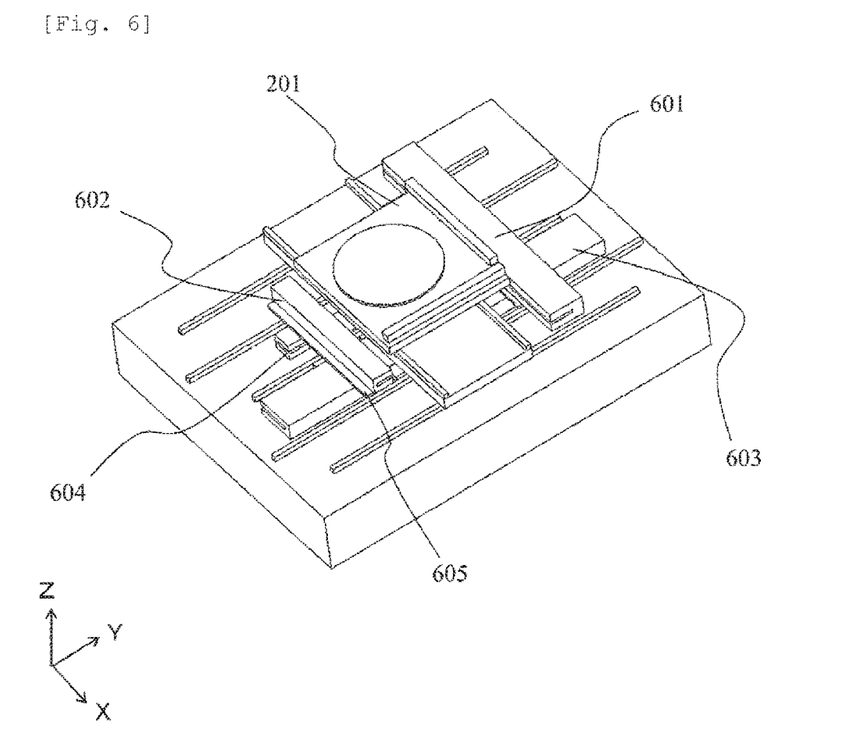
FIG. 6 is a view illustrating a configuration example using two sets of motors.

Referring to FIG. 6, a configuration example using two sets of motors is illustrated. Even in a case where a configuration in which motors 602 and 604 specialized for high resolution are mounted in addition to motors 601 and 603 specialized for high thrust is adopted, the mass of an object mounted on the lower-axis table 203 hardly increases, and it is possible to achieve compatibility between high speed and high accuracy.

As the motor stators 601 and 603, there are adopted motor stators that are manufactured to have a high magnetic flux density so that large thrust can be output with low current and have a large thrust constant (first moving mechanism). Additionally, as the motor stators 602 and 604, there are adopted motor stators that are manufactured such that the magnetic flux density become low and the thrust constant become small in order to suppress the generation of vibration against current noise (fourth moving mechanism). Additionally, since the motor stators 602 and 604 are sufficient if only the motor stators are capable of being driven within an SEM observation range, the cost can be reduced by shortening the stroke.

In the configuration as exemplified in FIG. 6, in addition to the motor mover 401 constituting the first moving mechanism and the motor mover 402 constituting the third moving mechanism as exemplified in FIG. 4, a motor mover (not illustrated), which constitutes a fifth moving mechanism that moves a movable body 605 supporting the motor 602 (stator) so as to follow the first moving mechanism or the third moving mechanism, is provided. Two movable bodies and two tables move in an interlocking manner in the example of FIG. 6.

As an operation method in a case where two motors are sued, the thrust motors 601 and 603 are used at the time of high-speed positioning, such as at the time of wafer replacement or movement between chips, to perform high-speed positioning with low current to suppress the motor heat generation. At the time of SEM observation, the motors 602 and 604 with low vibration are used to suppress image shaking resulting from current noise.

Figure 7:
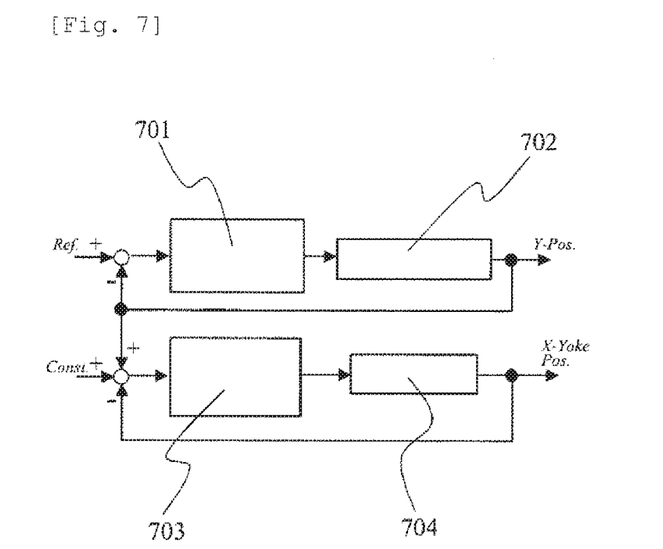
FIG. 7 is a view illustrating a positioning control system of the lower-axis table and the upper-axis stator.

Referring to FIG. 7, a positioning control system of the lower-axis table and the upper-axis stator is illustrated. FIG. 7 is a block diagram illustrating the configuration of a control system of the main stage. The upper-axis stator is independently controlled so as to always maintain a certain relative distance from the position of the lower-axis table. Lower-axis table plant characteristics 702 are controlled by a lower-axis table controller 701, the relative displacement between the lower-axis table and the upper-axis stator read by the linear scales 403 and 404 or the like is used as a command value of an upper-axis stator drive motor controller 703, and the positional control of upper-axis stator drive motor plant characteristics 704 is performed. In addition, a control system of the upper-axis table may be the same as a general control system.

Embodiment 2

Figure 8:
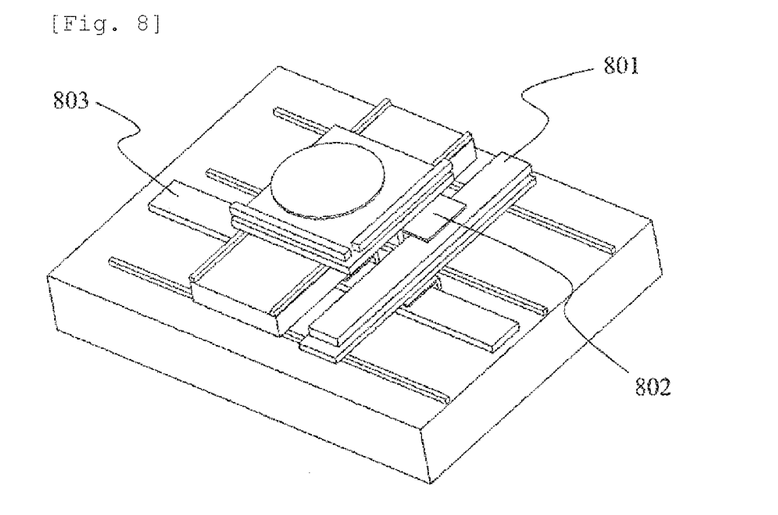
FIG. 8 is a view illustrating a configuration example in a case where the stator is a coil.

Referring to FIG. 8, a configuration example in which a moving magnet (MM) is made is illustrated. In this configuration, since the motor heat generation is not generated in the main stage and only the frictional heat of the guide is generated, it is possible to achieve a significant improvement in throughput. Additionally, as coils through which a current are made to flow are switched by a coil selector, it is possible to keep electromagnetic waves from coming out from coil portions not overlapping with magnets, and to prevent influence on image noise.

Additionally, since the amount of heat generation generated on the table side is made almost zero by attaching the upper-axis motor yoke 802 to the lower-axis table side and attaching the upper-axis motor coil 801 to the movable body side, it is possible to suppress the thermal expansion of the table. Since the drive mechanism on the lower-axis side is also the same and the lower-axis motor coil 803 is installed in non-contact with the table, it is possible to minimize the amount of heat generation on the table side as well.

Additionally, in a case where the moving magnet is made and the coil selector is used, it is necessary to wire a number of cables from the coils that are the stator. Since the resistance of the cables causes a positioning error when the stage is movable, there is a tradeoff between suppression of heat generation and an improvement in positioning accuracy. However, since the resistance of the cables does not become an error of the main stage by separating the stator as in the above configuration, it is possible to achieve high accuracy.

REFERENCE SIGNS LIST

101: ELECTRONIC OPTICAL SYSTEM LENS BARREL
104: LASER INTERFEROMETER
105: TABLE
106: WAFER
107: GUIDE
108: CHUCK
109: CONTROLLER
111: MIRROR
112: SAMPLE CHAMBER
113: VIBRATION-FREE MOUNT
201: UPPER-AXIS TABLE
202: UPPER-AXIS MOTOR STATOR
203: LOWER-AXIS TABLE
204: LOWER-AXIS MOTOR STATOR
205: GUIDE RAIL
206: SAMPLE CHAMBER BOTTOM SURFACE
207: UPPER-AXIS STATOR MOVABLE BODY
301: UPPER-AXIS MOTOR MOVER
401: MOTOR MOVER FOR DRIVING LOWER-AXIS TABLE
402: MOTOR MOVER DRIVING FOR UPPER-AXIS MOTOR STATOR
403: LOWER-AXIS SCALE HEAD
404: SCALE HEAD FOR MEASURING POSITION OF UPPER-AXIS MOTOR STATOR
405: LOWER-AXIS SCALE
501: LOWER-AXIS TABLE GUIDE RAIL
502: UPPER-AXIS STATOR GUIDE RAIL
601: UPPER-AXIS MOTOR STATOR A (LARGE THRUST)
602: UPPER-AXIS MOTOR STATOR B (HIGH RESOLUTION)
603: LOWER-AXIS MOTOR STATOR A (LARGE THRUST)
604: LOWER-AXIS MOTOR STATOR B (HIGH RESOLUTION)
701: LOWER-AXIS TABLE CONTROLLER
702: LOWER-AXIS TABLE PLANT CHARACTERISTICS
703: UPPER-AXIS STATOR DRIVE MOTOR CONTROLLER
704: UPPER-AXIS STATOR DRIVE MOTOR PLANT CHARACTERISTICS
801: UPPER-AXIS MOTOR COIL
802: UPPER-AXIS MOTOR YOKE
803: LOWER-AXIS MOTOR COIL

The invention claimed is:

1. A stage apparatus comprising:
a first table that supports a sample and moves the sample in a first direction;
a second table that moves the first table in a second direction different from the first direction; and
a first moving mechanism that generates a driving force for moving the first table in the first direction;
a second moving mechanism that generates a driving force for moving the second table in the second direction;
a movable body that supports a stator included in the first moving mechanism; and
a third moving mechanism that moves the movable body so as to follow the movement of the second table in the second movement direction.

2. The stage apparatus according to claim 1, wherein a mover included in the second moving mechanism and a mover included in the third moving mechanism move inside a common stator.

3. The stage apparatus according to claim 1, further comprising:
a scale installed along the second direction;
a first scale head installed in the second table so as to face the scale; and
a second scale head installed in the movable body so as to face the scale.

4. The stage apparatus according to claim 1, further comprising:
a first guide rail that guides the second table in the second direction; and
a second guide rail that guides the movable body in the second direction.

5. The stage apparatus according to claim 1, further comprising:
- a fourth moving mechanism that generates a driving force for moving the first table in the first direction;
- a movable body that supports a stator included in the fourth moving mechanism; and
- a fifth moving mechanism that moves the movable body so as to follow the movement of the second table in the second movement direction.

6. The stage apparatus according to claim 5,
- wherein a motor included in the first moving mechanism and a motor included in the fourth moving mechanism have different thrust constants.

7. A charged particle beam apparatus comprising:
- a charged particle beam lens barrel for irradiating a sample disposed within a sample chamber with a charged particle beam;
- a first table that supports the sample and moves the sample in a first direction;
- a second table that moves the first table in a second direction different from the first direction;
- a first moving mechanism that generates a driving force for moving the first table in the first direction;
- a second moving mechanism that generates a driving force for moving the second table in the second direction;
- a movable body that supports a stator included in the first moving mechanism; and
- a third moving mechanism that moves the movable body so as to follow the movement of the second table in the second movement direction.

* * * * *